United States Patent
Ohkubo

(10) Patent No.: US 7,911,585 B2
(45) Date of Patent: Mar. 22, 2011

(54) MEASUREMENT APPARATUS, EXPOSURE APPARATUS, AND DEVICE MANUFACTURING METHOD

(75) Inventor: Akinori Ohkubo, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 441 days.

(21) Appl. No.: 12/167,858

(22) Filed: Jul. 3, 2008

(65) Prior Publication Data

US 2009/0009740 A1    Jan. 8, 2009

(30) Foreign Application Priority Data

Jul. 5, 2007 (JP) .................................. 2007-177555

(51) Int. Cl.
*G03B 27/74* (2006.01)
*G03B 27/42* (2006.01)

(52) U.S. Cl. .......................................... 355/68; 355/53

(58) Field of Classification Search .................. 355/53, 355/55, 67–71; 356/121–124, 364, 399–401; 702/117

See application file for complete search history.

(56) References Cited

U.S. PATENT DOCUMENTS

| | | | |
|---|---|---|---|
| 5,631,731 A | | 5/1997 | Sogard |
| 6,850,327 B2* | | 2/2005 | Taniguchi et al. ............. 356/399 |
| 7,233,874 B2* | | 6/2007 | Ye et al. ......................... 702/117 |
| 7,791,718 B2* | | 9/2010 | Hagiwara ....................... 356/124 |

OTHER PUBLICATIONS

William N. Partlo, Charles H. Fields and William G. Oldham, "Direct aerial image measurement as a method of testing high numerical aperture monolithographic lenses", J. Vac. Sci. Technol. B, vol. 11 (1993) pp. 2686-2691.

* cited by examiner

*Primary Examiner* — Hung Henry Nguyen
(74) *Attorney, Agent, or Firm* — Canon U.S.A., Inc. I.P. Division

(57) ABSTRACT

A measurement apparatus configured to measure a light intensity distribution in a plane to be measured includes a mask including an opening having a dimension smaller than a wavelength of light for forming the light intensity distribution, and a light-shielding portion being configured to substantially shield the light; a first photoelectric conversion element configured to receive the light passing through the opening and output a light intensity signal; and a second photoelectric conversion element arranged at a position apart from the first photoelectric conversion element, and configured to receive the light transmitted through the light-shielding portion and output a light intensity signal. The mask, and the first and second photoelectric conversion elements are moved along the plane to be measured. The light intensity distribution in the plane to be measured is calculated on the basis of the light intensity signals respectively output from the first and second photoelectric conversion elements.

10 Claims, 8 Drawing Sheets

MEASUREMENT APPARATUS, EXPOSURE APPARATUS, AND DEVICE MANUFACTURING METHOD

BACKGROUND OF THE INVENTION

1. Field of the Invention

The present invention relates to a measurement apparatus for measuring a light intensity distribution in a plane to be measured, an exposure apparatus that includes the measurement apparatus, and a device manufacturing method using the exposure apparatus.

2. Description of the Related Art

Hitherto, an exposure apparatus used for manufacturing semiconductor devices exposes a resist applied on a wafer to light to evaluate an image-forming performance of the entire exposure apparatus including a light source, an illumination optical system, and a projection optical system. When the image-forming performance of the exposure apparatus is to be measured by exposing the resist to light, processes including development of the resist and observation of a resist image have to be repeated. Hence, performing measurement procedures can be seriously troublesome work, and it is difficult to measure the performance in a short time.

Regarding such problems, a technique of measuring a light intensity distribution on a wafer surface and evaluating an image-forming performance of an exposure apparatus without exposing a resist to light is suggested in William N. Partlo, Charles H. Fields and William G. Oldham, "Direct aerial image measurement as a method of testing high numerical aperture microlithographic lenses", J. Vac. Sci. Technol. B, vol. 11 (1993) pp. 2686-2691, and U.S. Pat. No. 5,631,731. These documents disclose a technique of measuring a light intensity on a wafer surface while moving a photodetector, and a mask including a micro-slit and a light-shielding portion, the micro-slit having a width equal to or smaller than a value obtained by dividing a wavelength of exposure light by a numerical aperture of a projection optical system.

In the related art technique for measuring the light intensity on the wafer surface using the photodetector and an opening such as the micro-slit, it is necessary to increase a thickness of the light-shielding portion so as to prevent light (transmitted through the light-shielding portion not occupied by the opening) from being incident on the photodetector. However, an increase in the thickness of the light-shielding portion may cause a non-linear optical effect to appear at the opening. With the effect, a light intensity distribution obtained from light transmitted through the opening may differ from a light intensity distribution obtained from light entering the opening. If the thickness of the light-shielding portion is decreased, the light-shielding portion provides insufficient light-shielding. The influence of light transmitted through the light-shielding portion may be increased.

As described above, the related art technique has a difficulty in accurately measuring an actual light intensity distribution on the wafer surface.

SUMMARY OF THE INVENTION

Accordingly, in measurement of a light intensity distribution, the present invention provides a measurement apparatus capable of preventing measurement accuracy from being degraded due to light transmitted through a light-shielding portion. Moreover, it is not necessary to increase a thickness of a mask that includes an opening and the light-shielding portion.

According to an aspect of the present invention, a measurement apparatus is configured to measure a light intensity distribution in a plane to be measured. The measurement apparatus includes a mask that has a light-shielding portion and an opening, the light-shielding portion configured to shield a large portion of light for forming the light intensity distribution, and the opening having a dimension smaller than a wavelength of the light and transmitting a smaller portion of the light therethrough. The measurement apparatus also includes a first photoelectric conversion element configured to receive light transmitted through the opening and output a light intensity signal and a second photoelectric conversion element arranged at a position apart from the first photoelectric conversion element. The second photoelectric conversion element is configured to receive light transmitted through the light-shielding portion and output a light intensity signal. The mask, the first photoelectric conversion element, and the second photoelectric conversion element are moved along the plane to be measured. The light intensity distribution is calculated based on the light intensity signal output from the first photoelectric conversion element and the light intensity signal output from the second photoelectric conversion element.

Further features and aspects of the present invention will become apparent from the following description of exemplary embodiments with reference to the attached drawings.

DESCRIPTION OF THE EMBODIMENTS

Figure 1:
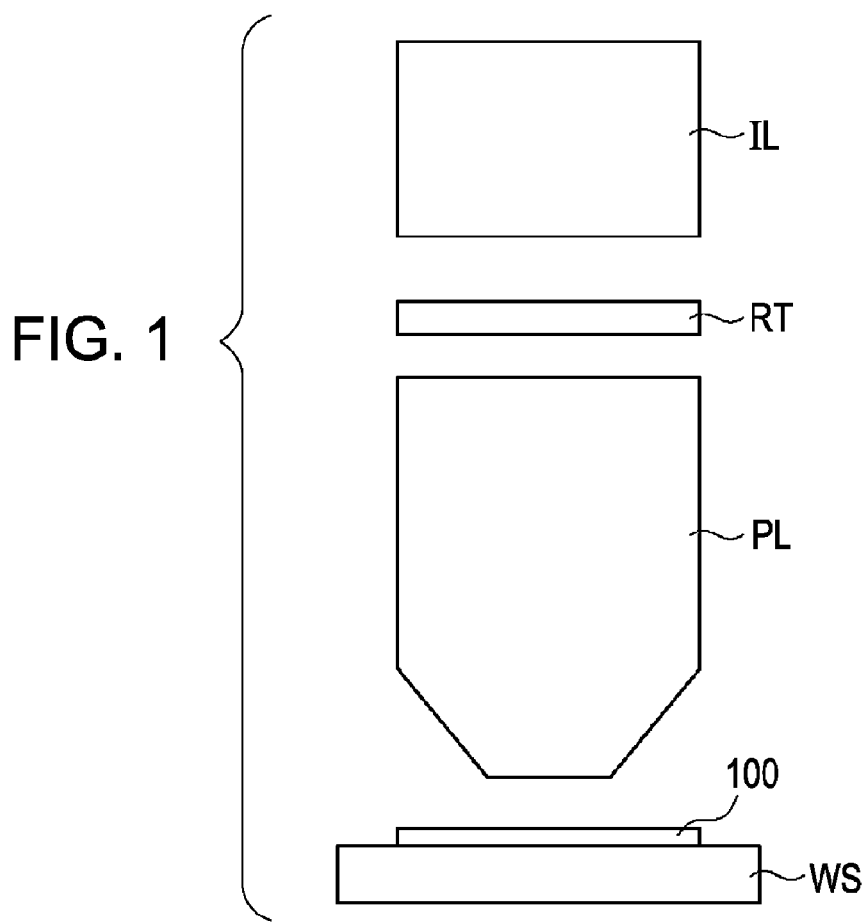
FIG. 1 is an explanatory illustration showing a measurement apparatus according to an embodiment of the present invention.

Embodiments of the present invention are described below with reference to the attached drawings. In the drawings, like numerals refer like components, and redundant description is omitted.

FIG. 1 is an illustration showing a measurement apparatus 100 according to an embodiment of the present invention. The measurement apparatus 100 measures a light intensity distribution formed with light incident on a plane to be measured. In this embodiment, the measurement apparatus 100 is embodied, as a measurement apparatus that measures a light intensity distribution on a wafer, in an exposure apparatus that exposes a wafer (substrate) to light to transfer a pattern of a reticle (original) on the wafer. The measurement apparatus 100 measures an image-forming performance of the entire exposure apparatus including a light source, an illumination optical system, and a projection optical system.

In FIG. 1, reference character IL denotes an illumination optical system including a light source. A reticle RT has a pattern. The reticle RT is mounted at a reticle stage (not shown). The illumination optical system IL irradiates the reticle RT with light. The light is diffracted at the pattern of the reticle RT and is incident on a projection optical system PL. The light incident on the projection optical system PL is collected with the projection optical system PL and forms an image of the pattern of the reticle RT in an image plane (e.g., on a wafer surface).

The measurement apparatus 100 is disposed on a wafer stage WS, in the image plane of the projection optical system PL for measurement of a light intensity distribution (aerial image) on a wafer surface, in a manner replaceable with a wafer. While light irradiation is provided by the illumination optical system IL, the measurement apparatus 100 drives a sensor unit SU (described later) and analyzes a light intensity signal output from the sensor unit SU. The analysis measures the light intensity distribution on the wafer surface. Hence, the wafer stage WS functions as a driving unit for driving the sensor unit SU.

Figure 2:
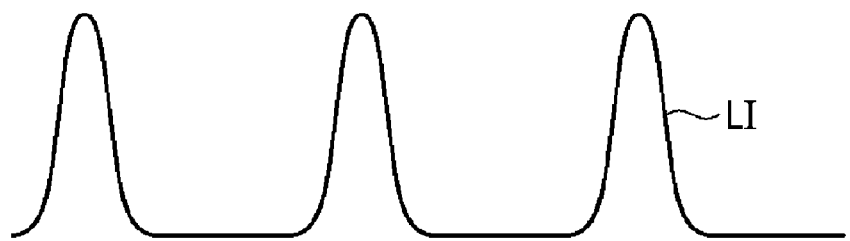
FIG. 2 is an illustration showing an example of a light intensity distribution formed on a wafer surface.

The measurement apparatus 100 is described below in more detail, according to an example in which the pattern formed at the reticle RT is a line-and-space (L & S) pattern having alternately arranged lines and spaces. In this case, a light intensity distribution (aerial image) LI as shown in FIG. 2 is formed on the wafer surface (in an image plane of the projection optical system PL). FIG. 2 is an illustration showing an example of a light intensity distribution LI formed on the wafer surface.

Figure 3:
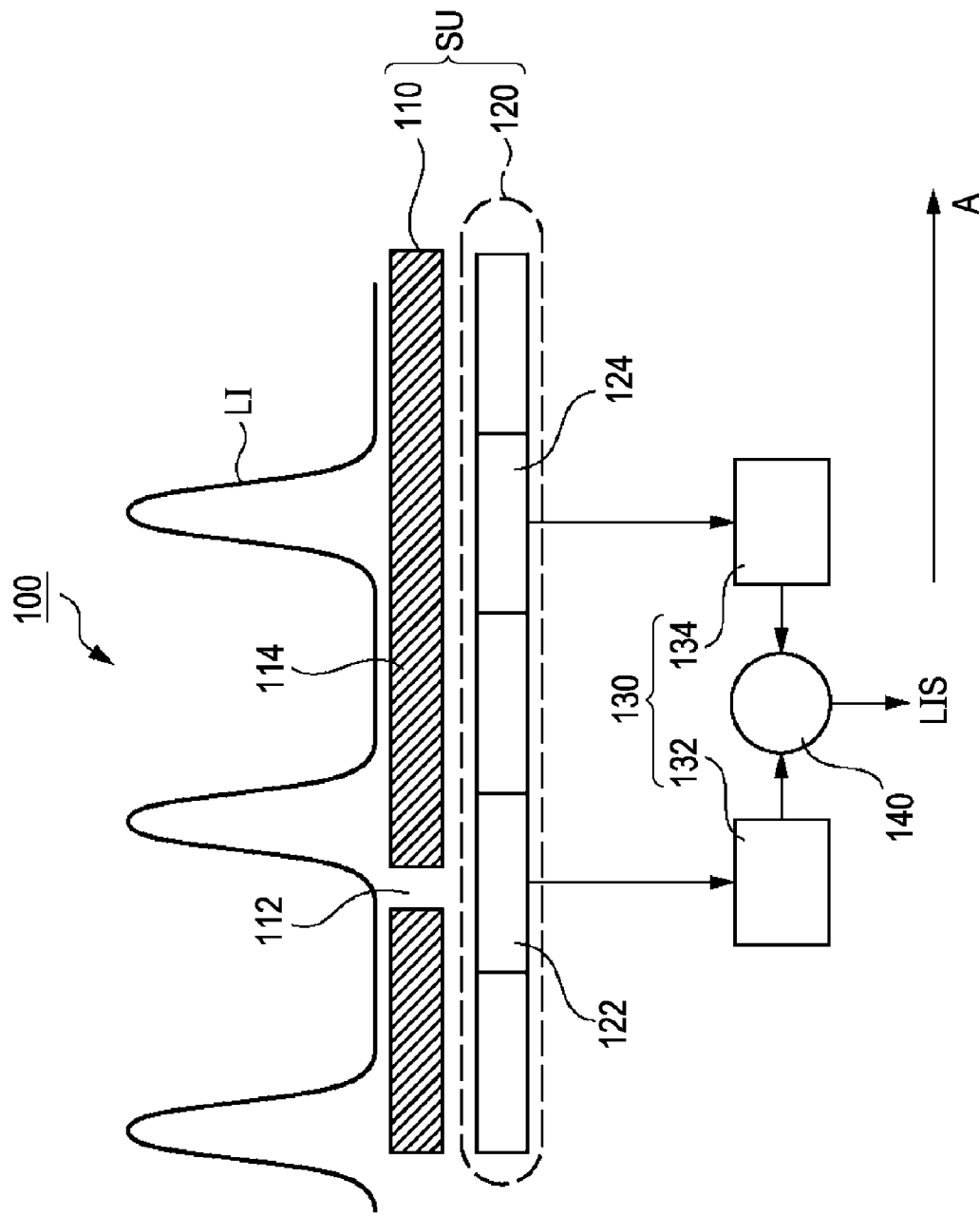
FIG. 3 is a cross section schematically showing a configuration of the measurement apparatus according to the embodiment of FIG. 1.

FIG. 3 is a cross section schematically showing a configuration of the measurement apparatus 100 according to the present embodiment. The measurement apparatus 100 includes the sensor unit SU having a mask 110 and a light intensity sensor 120, a storage unit 130, and a signal processing unit 140.

The mask 110 includes a slit (micro-slit) 112 and a light-shielding portion 114. The slit 112 serves as an opening having a width in a short-side direction smaller than a wavelength of light forming an intensity distribution LI. The light-shielding portion 114 is a light-shielding film made of metal, such as aluminum (Al) or tantalum (Ta). The opening of the mask 110 is not limited to the slit 112 and may be an opening having any form as long as the opening has a dimension smaller than the wavelength of the light forming the light intensity distribution LI. For example, the opening of the mask 110 may be a micro-pinhole. The light-shielding portion 114 transmits a little portion of the light, and, for example, may be formed of a light-shielding film.

The light intensity sensor 120 detects light through the mask 110 if the light intensity distribution LI formed on the light intensity sensor 120 has a certain degree of intensity. The light intensity sensor 120 includes a plurality of photodetectors. For example, the light intensity sensor 120 may be a CCD sensor, a CMOS sensor, a photodiode, or a split photodiode. The light intensity sensor 120 according to this embodiment includes a first photoelectric conversion element 122 disposed below the slit 112 and a second photoelectric conversion element 124 disposed at a position apart from the first photoelectric conversion element 122. The second photoelectric conversion element 124 is disposed below the light-shielding portion 114.

The first photoelectric conversion element 122 receives light transmitted through the slit 112 and outputs a light intensity signal corresponding to a light intensity of the received light to a first memory 132. The second photoelectric conversion element 124 receives light transmitted through the light-shielding portion 114 not occupied by the slit 112 and outputs a light intensity signal corresponding to a light intensity of the received light to a second memory 134. The sensor unit SU is driven with the wafer stage WS in a direction indicated by arrow A by a constant distance. The light intensity sensor 120 (the first and second photoelectric conversion elements 122 and 124) outputs light intensity signals every time the sensor unit SU is driven.

The storage unit 130 stores the light intensity signals output from the light intensity sensor 120. In this embodiment, the storage unit 130 includes a first memory 132 and a second memory 134. The first memory 132 stores a light intensity signal output from the first photoelectric conversion element 122 in association with position information that represents a position of the first photoelectric conversion element 122 at a time of receiving light with a light intensity corresponding to the light intensity signal thereof. The second memory 134 stores a light intensity signal output from the second photoelectric conversion element 124 in association with position information that represents a position of the second photoelectric conversion element 124 at a time of receiving light with a light intensity corresponding to the light intensity signal thereof.

The signal processing unit 140 reads light intensity signals associated with equivalent position information (that is, corresponding to the same position information) from the storage unit 130 (respectively from the first and second memories 132 and 134) and calculates a light intensity distribution LI on the wafer surface. Light received with the first photoelectric conversion element 122 contains light transmitted through the slit 112 and light transmitted through the light-shielding portion 114 located around the slit 112. The signal processing unit 140 reads light intensity signals associated with the same position information respectively from the first and second memories 132 and 134 and subtracts the light intensity signal read from the second memory 134 from the light intensity signal read from the first memory 132. The obtained signal is determined as a light intensity signal LIS at the position of the slit 112. Thus, the effect of the light transmitted through the light-shielding portion 114 located around the slit 112 can be corrected, and the light intensity distribution LI can be measured highly accurately. As described above, the signal processing unit 140 calculates the light intensity distribution LI based on the light intensity signal output from the first photoelectric conversion element 122 and the light intensity signal output from the second photoelectric conversion element 124. If the signal processing unit 140 can store (or determine) light intensity signals having equivalent position information (that is, corresponding to the same position information), the measurement apparatus 100 does not have to include the storage unit 130.

Figure 4:
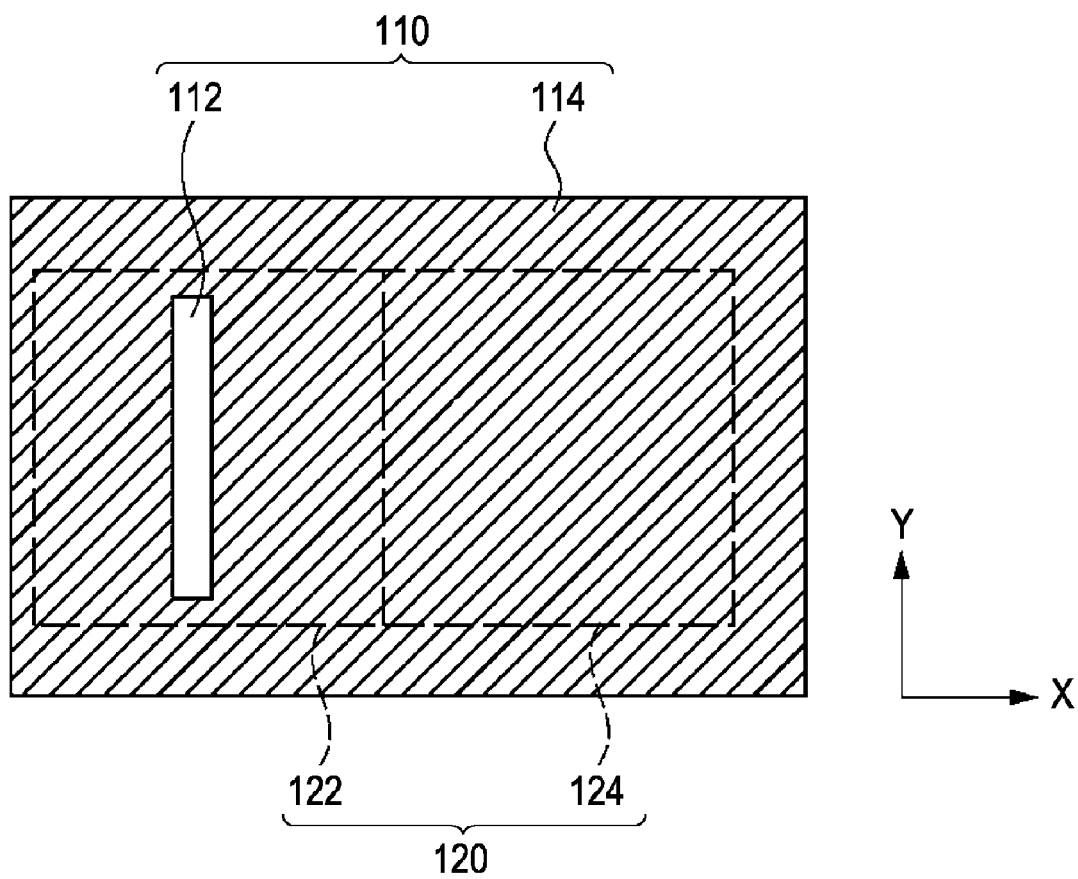
FIG. 4 is an illustration showing an example of a positional relationship between a mask (which includes a slit and a light-shielding portion) and first and second photoelectric conversion elements in the measurement apparatus shown in FIG. 3.

Now, a measurement operation of a light intensity distribution LI with the measurement apparatus 100 is described. In this embodiment, the slit 112, the light-shielding portion 114 and the light intensity sensor 120 (the first and second photoelectric conversion elements 122 and 124) are arranged according to a positional relationship shown in FIG. 4 as viewed from the projection optical system PL. Referring to FIG. 4, the first photoelectric conversion element 122 is disposed below the slit 112 of the mask 110. The second photoelectric conversion element 124 is disposed at a position in a direction perpendicular to a longitudinal direction of the slit 112 (below the light-shielding portion 114 of the mask 110) with respect to the first photoelectric conversion element 122. In the positional relationship, the first and second memories 132 and 134 store the light intensity signals output from the first and second photoelectric conversion elements 122 and 124 while the sensor unit SU is driven in an X-direction in FIG. 4 by a distance corresponding to a necessary spatial resolution. Driving of the sensor unit SU and storing of the light intensity signals output from the first and second photoelectric conversion elements 122 and 124 are repeated within a spatial distance necessary for a measurement. FIG. 4 is an illustration showing an example of the positional relationship between the mask 110 (which includes the slit 112 and the light-shielding portion 114) and the first and second photoelectric conversion elements 122 and 124. A Y-direction is also shown in FIG. 4 which assists the reader in comparing FIG. 4 to FIG. 7.

Figure 5:
FIG. 5 is a graph showing a light intensity distribution formed on a sensor unit.
Figure 6:
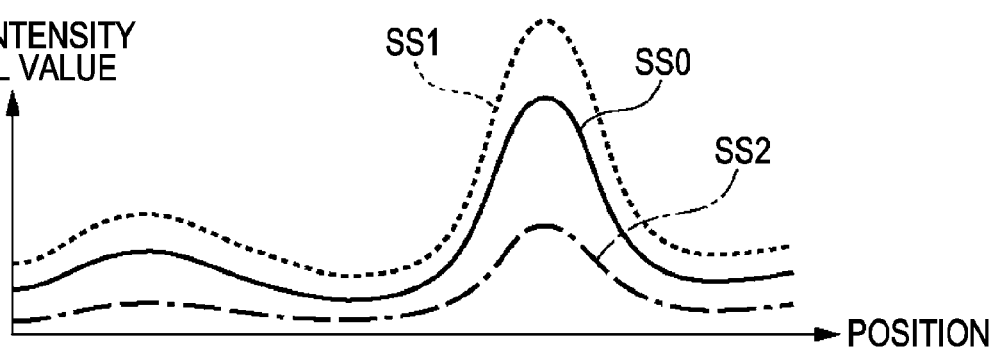
FIG. 6 is a graph showing light intensity signals output from the first and second photoelectric conversion elements when the measurement apparatus measures the light intensity distribution shown in FIG. 5.

FIG. 5 shows a light intensity distribution Int0 formed on the sensor unit SU. In FIG. 5, the vertical axis plots the light intensity and the lateral axis plots the position on the wafer surface in the X-direction. FIG. 6 shows light intensity signals SS1 and SS2 respectively output from the first and second photoelectric conversion elements 122 and 124 when the measurement apparatus 100 measures the light intensity distribution Int0 shown in FIG. 5. In FIG. 6, the vertical axis plots the light intensity signal value, and the lateral axis plots the position of the first or second photoelectric conversion element 122 or 124.

Referring to FIG. 5, the light intensity distribution Int0 has a spatially varying light intensity. Referring to FIG. 6, the light intensity signal SS1 is a signal from the first photoelectric conversion element 122 corresponding to a position of the first photoelectric conversion element 122 when the sensor unit SU is driven in the X-direction. If the slit 112 is infinitely narrow, and the light-shielding portion 114 is infinitely thin and completely shields light, the photoelectric conversion element 122 can strictly (or highly accurately) measure the light intensity distribution Int0. However, the light intensity signal SS1 is an integrated value of a light intensity signal corresponding to a light intensity of light transmitted through the slit 112 and a light intensity signal corresponding to a light intensity of light transmitted through the light-shielding portion 114 located around the slit 112. Hence, the light intensity signal SS1 does not strictly represent the light intensity distribution Int0. Also, the light intensity signal SS2 output from the second photoelectric conversion element 124 is a light intensity signal corresponding to a light intensity of light transmitted through the light-shielding portion 114. The light intensity signal SS2 provides a distribution with an intensity attenuated in accordance with a light-shielding performance of the light-shielding portion 114.

The first memory 132 stores the light intensity signal SS1 from the first photoelectric conversion element 122, and the second memory 134 stores the light intensity signal SS2 from the second photoelectric conversion element 124. Also, as described above, the first and second memories 132 and 134 respectively store position information of the first photoelectric conversion element 122 at a time of acquiring the light intensity signal SS1 and position information of the second photoelectric conversion element 124 at a time of acquiring the light intensity signal SS2.

Then, the signal processing unit 140 calculates the light intensity distribution on the sensor unit SU. The calculation is based on the light intensity signal SS1 with the position information and the light intensity signal SS2 with the position information stored in the first and second memories 132 and 134. In particular, the light intensity signal SS2 is subtracted from the light intensity signal SS1, the light intensity signals SS1 and SS2 having the same position information, so as to calculate a light intensity signal SS0 shown in FIG. 6. The light intensity signal SS0 calculated with the signal processing unit 140 agrees with the light intensity distribution Int0 shown in FIG. 5. Thus, the light intensity distribution in the space where the sensor unit SU is driven can be accurately measured with high precision.

Figure 7:
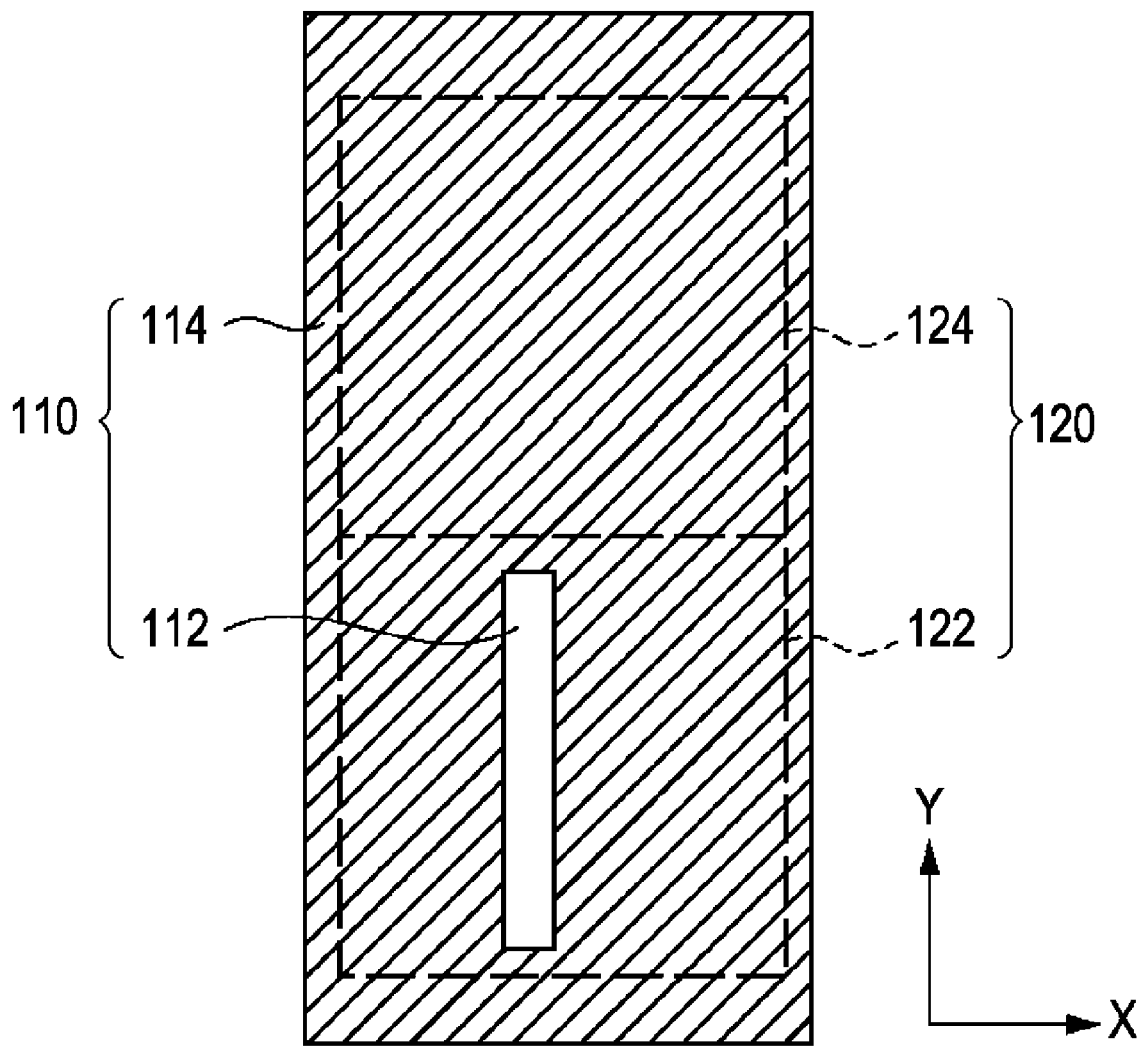
FIG. 7 is an illustration showing another example of a positional relationship between a mask (which includes a slit and a light-shielding portion) and first and second photoelectric conversion elements in the measurement apparatus shown in FIG. 3.

In this embodiment, the second photoelectric conversion element 124 is disposed at the position in the direction perpendicular to the longitudinal direction of the slit 112 with respect to the first photoelectric conversion element 122. Alternatively, as shown in FIG. 7, the second photoelectric conversion element 124 may be disposed at a position in a direction perpendicular to a short-side direction of the slit 112. Even when the first and second photoelectric conversion elements 122 and 124 are adjacently provided according to the arrangement, diffracted light from the slit 112 can be prevented from being incident on the second photoelectric conversion element 124. The second photoelectric conversion element 124 receives only light transmitted through the light-shielding portion 114. As another alternative, when the light intensity sensor 120 is a CCD sensor, the arrangement in FIG. 4 and the arrangement in FIG. 7 may be selectively used in accordance with a reading method of the CCD sensor. As yet another alternative, a plurality of second photoelectric conversion elements 124 may be arranged. In this case, an average signal of a plurality of light intensity signals respectively output from the plurality of second photoelectric conversion elements 124 may be used for an operation with a light intensity signal output from the first photoelectric conversion element 122. FIG. 7 is an illustration showing an example of a positional relationship between the mask 110 (which includes the slit 112 and the light-shielding portion 114) and the first and second photoelectric conversion elements 122 and 124. An X-direction and a Y-direction are illustrated.

Figure 8:
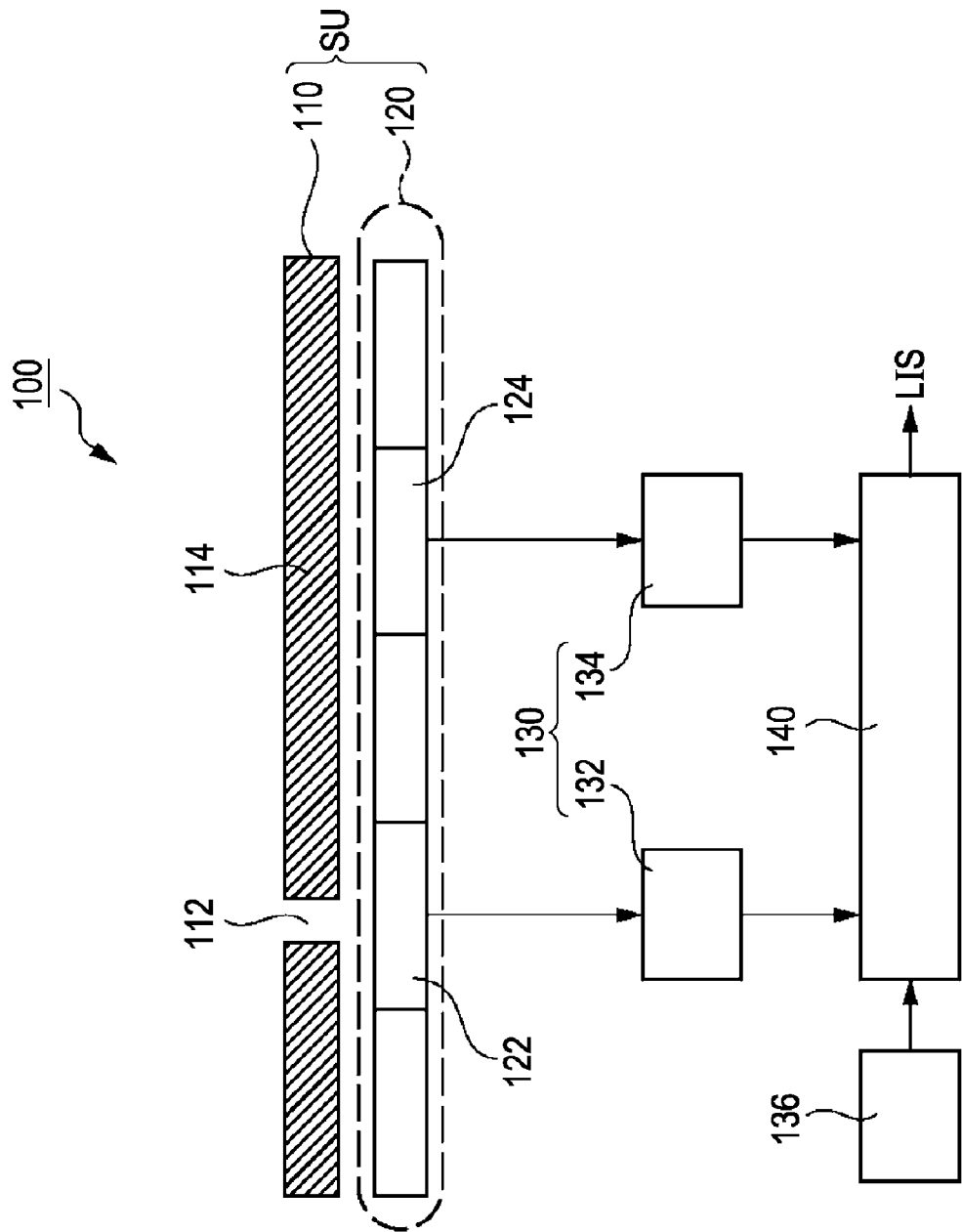
FIG. 8 is a cross section schematically showing a configuration of a measurement apparatus according to an embodiment of the present invention.

The signal processing unit 140 may calculate a light intensity distribution by using a transmission characteristic of the slit 112 stored in a third memory as shown in FIG. 8, in addition to using the light intensity signals from the first and second photoelectric conversion elements 122 and 124 of light intensity sensor 120. The transmission characteristic of the slit 112 can be obtained in advance by utilizing, for example, electromagnetic field analysis, such as a finite-difference time-domain (FDTD) analysis, based on optical measurement of (or the shape of) the slit 112. FIG. 8 is a cross section schematically showing a configuration of the measurement apparatus 100 according to an embodiment of the present invention.

The signal processing unit 140 reads the light intensity signals of the first and second photoelectric conversion elements 122 and 124 with the position information from the first and second memories 132 and 134 of the storage unit 130 and also reads the transmission characteristic of the slit 112 from a third memory 136. Also, the signal processing unit 140 calculates a light intensity distribution LIS through an operation using the light intensity signal of the first photoelectric conversion element 122 with the position information, the light intensity signal of the second photoelectric conversion element 124 with the position information, and the transmission characteristic of the slit 112.

Figure 9:
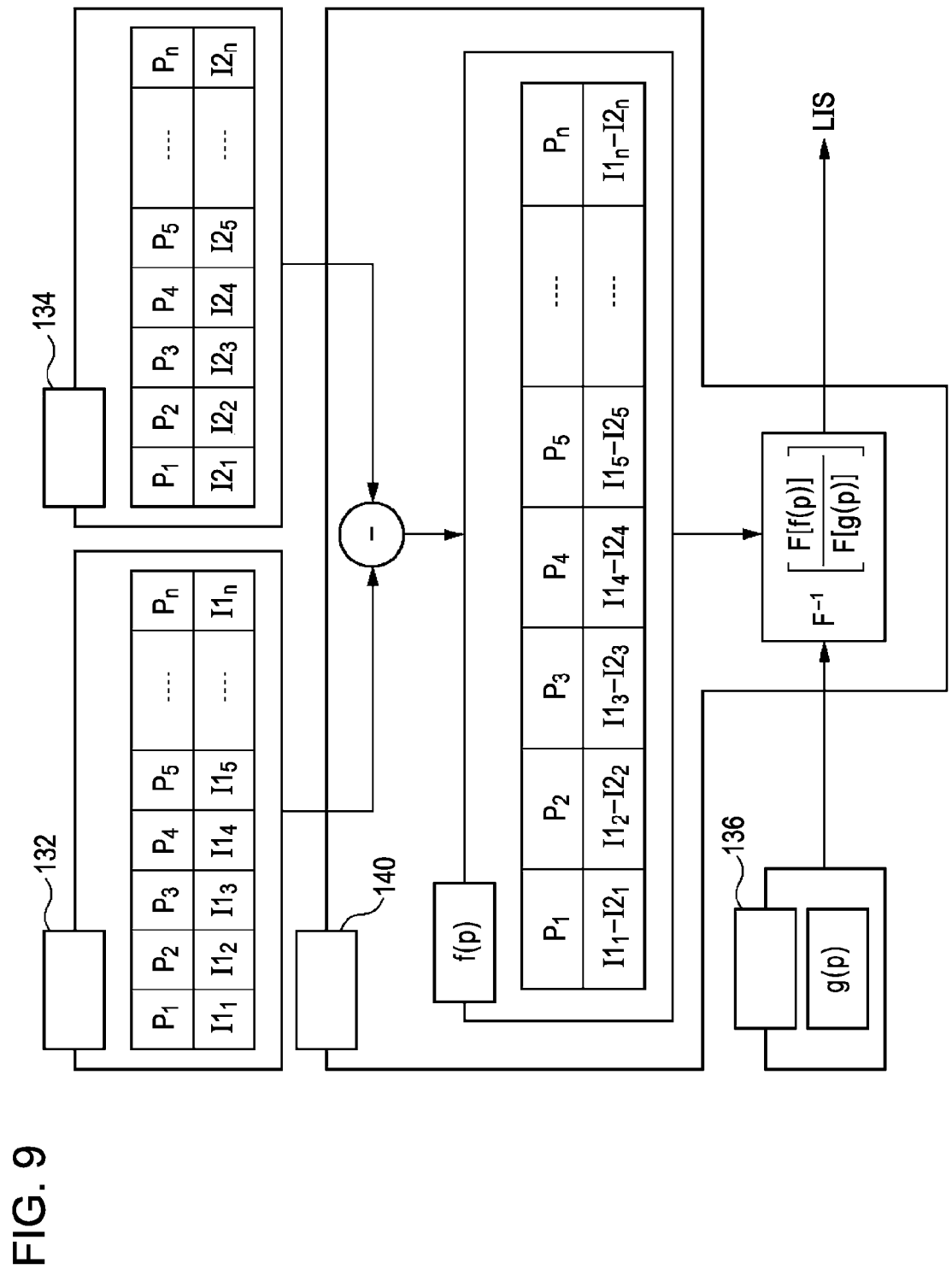
FIG. 9 is a diagram showing an example of an operation performed with a signal processing unit in the measurement apparatus shown in FIG. 8.

Specifically, the signal processing unit 140 performs an operation shown in FIG. 9. FIG. 9 is a diagram showing an example of an operation performed with the signal processing unit 140 (that is, calculation for the light intensity signal LIS by the signal processing unit 140). The first memory 132 has a number n of position information memory cells storing positions (position information) $P_1$ to $P_n$ of the first photoelectric conversion element 122 and a number n of signal memory cells storing light intensity signals $I1_1$ to $I1_n$ read at the positions $P_1$ to $P_n$. The second memory 134 has a number n of position information memory cells storing positions (position information) $P_1$ to $P_n$ of the second photoelectric conversion element 124 and a number n of signal memory cells storing light intensity signals $I2_1$ to $I2_n$ read at the positions $P_1$ to $P_n$.

If the position of the first photoelectric conversion element 122 is $P_1$ at a certain time, a signal memory cell stores a light intensity signal $I1_1$ output from the first photoelectric conversion element 122, and a position information memory cell stores a position $P_1$ of the first photoelectric conversion element 122. At this time, the position of the second photoelectric conversion element 124 is different from the position of the first photoelectric conversion element 122. For example, if the position of the second photoelectric conversion element 124 is $P_3$, a light intensity signal $I2_3$ output from the second photoelectric conversion element 124 is stored in a signal memory cell, and a position $P_3$ of the second photoelectric conversion element 124 is stored in a position information memory cell.

Then, the sensor unit SU is driven by a constant distance that is sufficiently smaller than a fluctuation range of the light intensity distribution, so as to move the position of the first photoelectric conversion element 122 from $P_1$ to $P_2$. Then, a light intensity signal $I1_2$ output from the first photoelectric conversion element 122 is stored in a signal memory cell, and a position $P_2$ of the first photoelectric conversion element 122 is stored in a position information memory cell. Meanwhile, the position of the second photoelectric conversion element 124 is moved from the position $P_3$ to a position $P_4$. At this time, a light intensity signal $I2_4$ output from the second photoelectric conversion element 124 is stored in a signal memory cell, and the position $P_4$ of the second photoelectric conversion element 124 is stored in a position information memory cell. Repeating these steps a plurality of times, light intensity signals are sequentially stored in the signal memory cells of the first and second memories 132 and 134, and positions of the first and second photoelectric conversion elements 122 and 124 are sequentially stored in the position information memory cells of the first and second memories 132 and 134.

Then, based on a combination of light intensity signals having the same position information, the signal processing unit 140 respectively subtracts the light intensity signals stored in (the signal memory cells of) the second memory 134 from the light intensity signals stored in (the signal memory cells of) the first memory 132. Accordingly, the light intensity signals may be $(I1_1-I2_1)$ to $(I1_n-I2_n)$. Based on of the light intensity signals $(I1_1-I2_1)$ to $(I1_n-I2_n)$ and the positions $P_1$ to $P_n$, the signal processing unit 140 calculates a function f(p) using positions of the first and second photoelectric conversion elements 122 and 124 as parameters.

Then, the signal processing unit 140 performs deconvolution processing using the function f(p) and a function g(p) representing the transmission characteristic of the slit 112 stored in the third memory 136. The deconvolution processing is performed as follows:

$$F^{-1}[F[f(p)]/F[g(p)]]$$

where F is an operation of Fourier transform and $F^{-1}$ is an operation of inverse Fourier transform. Since the signal processing unit 140 performs the processing, the light intensity distribution formed on the sensor unit SU can be measured highly accurately.

Although the simple subtraction is applied to the light intensity signal from the first photoelectric conversion element 122 and the light intensity signal from the second photoelectric conversion element 124, the operation may alternatively use a correction factor. For example, the correction factor may correct for a sensitivity of the light intensity sensor 120, an unevenness of the thickness of the light-shielding portion 114, or the like. Also, the signal processing unit 140 may perform other processing in addition to the deconvolution processing. Further, the function g(p) representing the transmission characteristic of the slit 112 stored in the third memory 136 does not have to be a single function. For example, a plurality of functions regarding an incidence angle distribution relating to image formation may alternatively be used.

In a related art technique, it is necessary to increase the thickness of a mask to obtain adequate light-shielding performance of a light-shielding portion (not occupied by an opening). As a result, the relationship between the light intensity obtained from light transmitted through the opening and the light intensity obtained from light entering the opening may be non-linear. Owing to this, the measurement accuracy for the light intensity distribution is seriously degraded.

In contrast, the measurement apparatus 100 according to this embodiment, as described above, the effect of light transmitted through the light-shielding portion 114 not occupied by the slit 112 functioning as the opening can be eliminated. Accordingly, it is not necessary to increase the thickness of the mask 110, and the light intensity distribution can be accurately measured with high precision.

Figure 10:
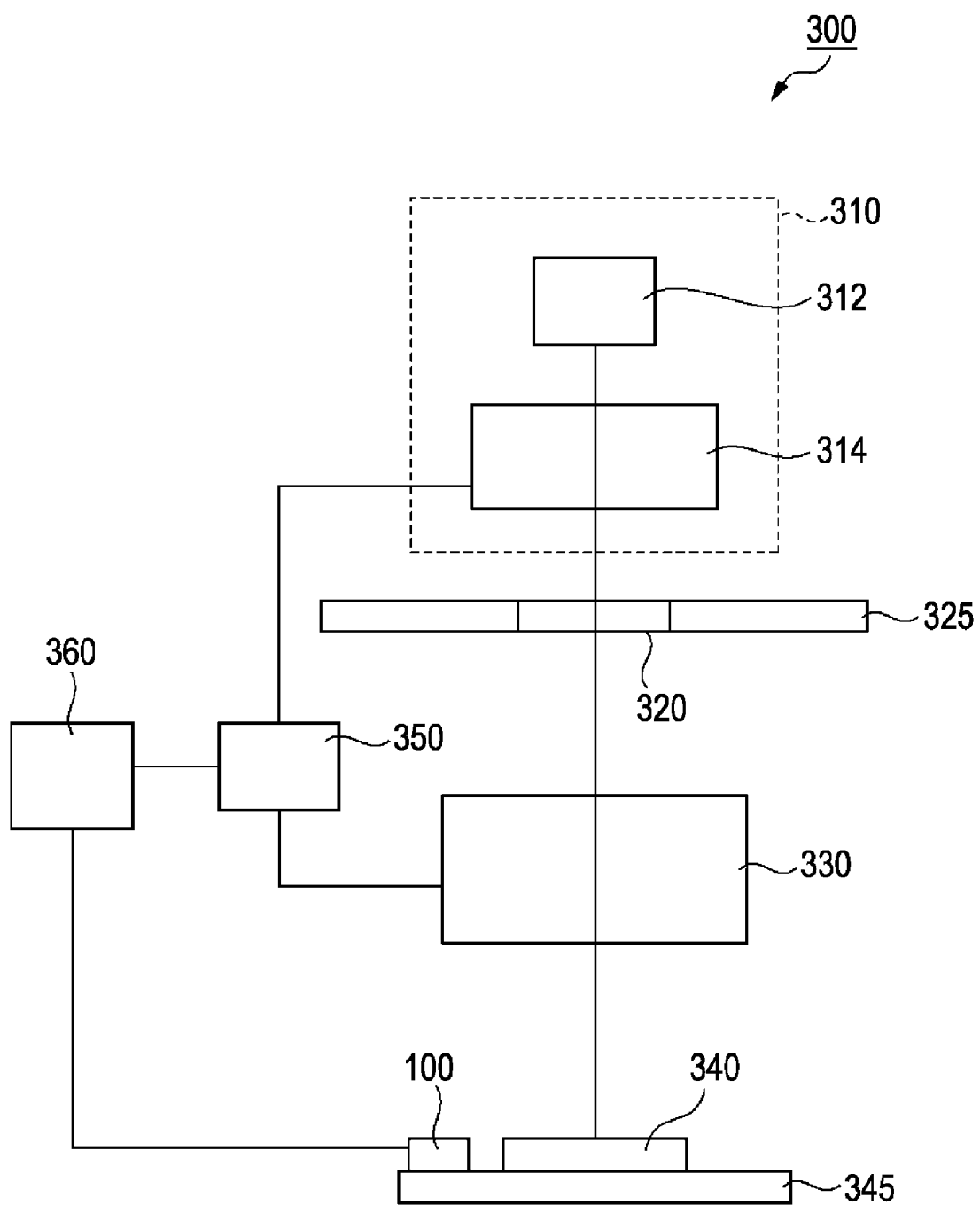
FIG. 10 is a cross section schematically showing a configuration of an exposure apparatus according to an embodiment of the present invention.

Next, an exposure apparatus 300 to which the measurement apparatus 100 is applied is described. FIG. 10 is a cross section schematically showing a configuration of the exposure apparatus 300 according to the embodiment of the present invention. The exposure apparatus 300 of this embodiment is a step-and-scan projection exposure apparatus that exposes a wafer 340 to light to transfer a pattern of a reticle 320 on the wafer 340. Alternatively, the present invention may be applied to a step-and-repeat exposure apparatus.

The exposure apparatus 300 includes an illumination unit 310, a reticle stage 325 that supports the reticle 320, a projection optical system 330, a wafer stage 345 that supports the wafer 340 or the measurement apparatus 100, the measurement apparatus 100, an adjustment unit 350, and a control unit 360.

The illumination unit 310 illuminates the reticle 320 having a circuit pattern for transferring. The illumination unit 310 includes a light source portion 312 and an illumination optical system 314.

In this embodiment, the light source portion 312 uses an ArF excimer laser with a wavelength of 193 nm. The light source portion 312 alternatively may use other types of laser or lamp.

The illumination optical system 314 is an optical system that illuminates the reticle 320 with light from the light source portion 312.

The reticle (photomask) 320 functioning as an original has a circuit pattern and is supported and driven by the reticle stage 325. Diffracted light from the reticle 320 is projected on the wafer 340 through the projection optical system 330.

The reticle stage 325 supports the reticle 320. The reticle stage 325 is connected to a moving mechanism (not shown). The moving mechanism (not shown) may include a linear motor for example. The reticle 320 can be moved as the reticle stage 325 is driven.

The projection optical system 330 is an optical system that projects the pattern of the reticle 320 on the wafer 340. For example, the projection optical system 330 may be a refracting optical system, a catadioptric system, or a reflecting optical system.

The wafer 340 is a substrate on which the pattern of the reticle 320 is projected (transferred). The wafer 340 may be replaced with a glass plate or other substrate. The wafer 340 has a photoresist applied thereon.

The wafer stage 345 supports the wafer 340 or the measurement apparatus 100. For example, the wafer stage 345 drives the wafer 340 or the measurement apparatus 100 with a linear motor. On the wafer stage 345, the wafer 340 is arranged in an image plane of the projection optical system 330 when the wafer 340 is to be exposed to light, whereas the measurement apparatus 100 is arranged in the image plane of the projection optical system 330 when the light intensity distribution on the wafer 340 is to be measured.

The measurement apparatus 100 is arranged on the wafer stage 345 to measure the light intensity distribution on the wafer 340. The measurement apparatus 100 may have any configuration selected from the above-described embodiments. A measurement result of the measurement apparatus 100 is used for an adjustment or an inspection for members relating to optical characteristics of the light source portion 312, the illumination optical system 314, and the projection optical system 330.

The adjustment unit 350 adjusts an optical performance of the exposure apparatus 300 under the control of the control unit 360. In this embodiment, the adjustment unit 350 is embodied as a driving mechanism that drives optical members of the illumination optical system 314 or a driving mechanism that drives optical members of the projection optical system 330. The adjustment unit 350 adjusts at least one of the illumination optical system 314 and the projection optical system 330.

The control unit 360 includes a CPU and a memory. The control unit 360 controls an operation of the exposure apparatus 300. In this embodiment, the control unit 360 controls the adjustment unit 350 based on the light intensity distribution on the wafer 340 measured with the measurement apparatus 100. In particular, the control unit 360 controls the position or posture of a lens of the illumination optical system 314 or the projection optical system 330 with the adjustment unit 350 so that the light intensity distribution on the wafer 340 becomes a desired light intensity distribution.

In the operation of the exposure apparatus 300, first, the light intensity distribution on the wafer 340 is measured. The light intensity distribution on the wafer 340 is measured with the measurement apparatus 100 as described above. When a measurement is made for the light intensity distribution on the wafer 340, the illumination optical system 314 or the projection optical system 330 are adjusted based on the measurement result. Accordingly, the exposure apparatus 300 having an excellent exposure performance (image-forming performance) can be obtained.

Then, the wafer 340 is exposed to light to transfer the pattern of the reticle 320 on the wafer 340. The illumination optical system 314 illuminates the reticle 320 with light emitted from the light source portion 312. The light involving the pattern of the reticle 320 forms an image on the wafer 340 through the projection optical system 330. At this time, the exposure apparatus 300 is adjusted in advance so that a desired light intensity distribution is formed on the wafer 340. Thus, high throughput, economical, high quality devices (semiconductor devices, liquid crystal display devices, etc.) can be provided.

With the use of an exposure apparatus according to any of the embodiments described above, devices can be manufactured by exposing a substrate (wafer, glass plate, etc.) coated or partially coated with a photoresist to light; developing the substrate; and applying other typical processes.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-177555 filed Jul. 5, 2007, which is hereby incorporated by reference herein in its entirety.

What is claimed is:

1. A measurement apparatus configured to measure a light intensity distribution in a plane to be measured, comprising:
   a mask including a light-shielding portion and an opening, the light-shielding portion configured to shield a large portion of light for forming the light intensity distribution, the opening having a dimension smaller than a wavelength of the light and transmitting a smaller portion of the light therethrough;
   a first photoelectric conversion element configured to receive light transmitted through the opening and output a light intensity signal; and
   a second photoelectric conversion element arranged at a position apart from the first photoelectric conversion element, the second photoelectric conversion element configured to receive light transmitted through the light-shielding portion and output a light intensity signal;
   wherein the mask, the first photoelectric conversion element, and the second photoelectric conversion element are moved along the plane to be measured; and
   wherein the light intensity distribution is calculated based on the light intensity signal output from the first photoelectric conversion element and the light intensity signal output from the second photoelectric conversion element.

2. The measurement apparatus according to claim 1, further comprising a signal-processing unit configured to calculate the light intensity distribution based on the light intensity signal output from the first photoelectric conversion element and the light intensity signal output from the second photoelectric conversion element.

3. The measurement apparatus according to claim 2, further comprising a storage unit configured to store the light intensity signal output from the first photoelectric conversion element in association with position information that represents a position of the first photoelectric conversion element at a time of receiving the light corresponding to the light intensity signal thereof, with the storage unit further configured to store the light intensity signal output from the second photoelectric conversion element in association with position information that represents a position of the second photoelectric conversion element at a time of receiving the light corresponding to the light intensity signal thereof.

4. The measurement apparatus according to claim 3,
wherein the storage unit is configured to store a transmission characteristic of the opening, and
wherein the signal-processing unit reads light intensity signals associated with equivalent position information from the storage unit, calculates a function using the position information as a parameter by subtracting the light intensity signal output from the second photoelectric conversion element from the light intensity signal output from the first photoelectric conversion element, and performs deconvolution processing using the transmission characteristic and the function.

5. The measurement apparatus according to claim 1,
wherein the opening is a slit having a width smaller than a wavelength of the light in a short-side direction of the slit, and
wherein the second photoelectric conversion element is arranged in a direction perpendicular to the short-side direction of the slit with respect to the first photoelectric conversion element.

6. The measurement apparatus according to claim 1,
wherein the opening is a slit having a width smaller than a wavelength of the light in a short-side direction of the slit, and
wherein the second photoelectric conversion element is arranged in a direction perpendicular to a longitudinal direction of the slit with respect to the first photoelectric conversion element.

7. An exposure apparatus comprising:
an illumination optical system configured to illuminate an original with light from a light source;
a projection optical system configured to project a pattern of the original on a substrate arranged in an image plane of the projection optical system; and
the measurement apparatus according to claim 1, wherein the measurement apparatus is configured to measure a light intensity distribution in the image plane.

8. The exposure apparatus according to claim 7, further comprising an adjustment unit configured to adjust at least one of the illumination optical system and the projection optical system based on a measurement result of the measurement apparatus.

9. A device manufacturing method comprising the steps of:
exposing a substrate by using the exposure apparatus according to claim 7; and
developing the exposed substrate.

10. A device manufacturing method comprising the steps of:
exposing a substrate by using the measurement apparatus according to claim 1; and
developing the exposed substrate.

\* \* \* \* \*